United States Patent [19]

Su

[11] Patent Number: 5,777,940
[45] Date of Patent: Jul. 7, 1998

[54] CIRCUIT WITH REGULATED POWER SUPPLY FOR REDUCING MEMORY DEVICE OPERATING POWER

[75] Inventor: Yuan-Mou Su, Cupertino, Calif.

[73] Assignee: Winbond Electronics Corp., Hsinchu, Taiwan

[21] Appl. No.: 747,699

[22] Filed: Nov. 12, 1996

[51] Int. Cl.$^6$ ...................................... G11C 8/00
[52] U.S. Cl. .............. 365/226; 365/189.09; 365/189.11; 365/230.06
[58] Field of Search ................. 365/226, 230.06, 365/189.11, 189.09

[56] References Cited

U.S. PATENT DOCUMENTS

| | | | |
|---|---|---|---|
| 5,263,001 | 11/1993 | Youn et al. | 365/227 |
| 5,404,329 | 4/1995 | Yamagata et al. | 365/189.09 |
| 5,550,504 | 8/1996 | Ogihara | 327/537 |
| 5,557,580 | 9/1996 | Numaga et al. | 365/230.06 |
| 5,602,784 | 2/1997 | Kojima et al. | 365/189.09 |

*Primary Examiner*—David C. Nelms
*Assistant Examiner*—Hien Nguyen
*Attorney, Agent, or Firm*—Meltzer, Lippe, Goldstein, Wolf, & Schlissel, P.C.

[57] ABSTRACT

In accordance with a preferred embodiment of the invention, the wordline turn on voltage in an SRAM array is suppressed (e.g., maintained at or below 4.5 volts). This is accomplished by connecting a regulated voltage supply output to the wordline. The regulated voltage supply has a transfer function such that the Vccr (the output of the regulated voltage supply) does not exceed a threshold such as 4.5 volts. For example, the transfer function may be:

Vccr=Vcc for Vcc<4.5 volts

Vccr=4.5 volts for Vcc≧4.5 volts where Vcc is the power supply voltage.

As indicated above, the power consumed in an SRAM array is proportional to the selected wordline voltage. In accordance with the present invention, the power consumption will be generally unchanged when Vcc exceeds 4.5 volts.

4 Claims, 5 Drawing Sheets

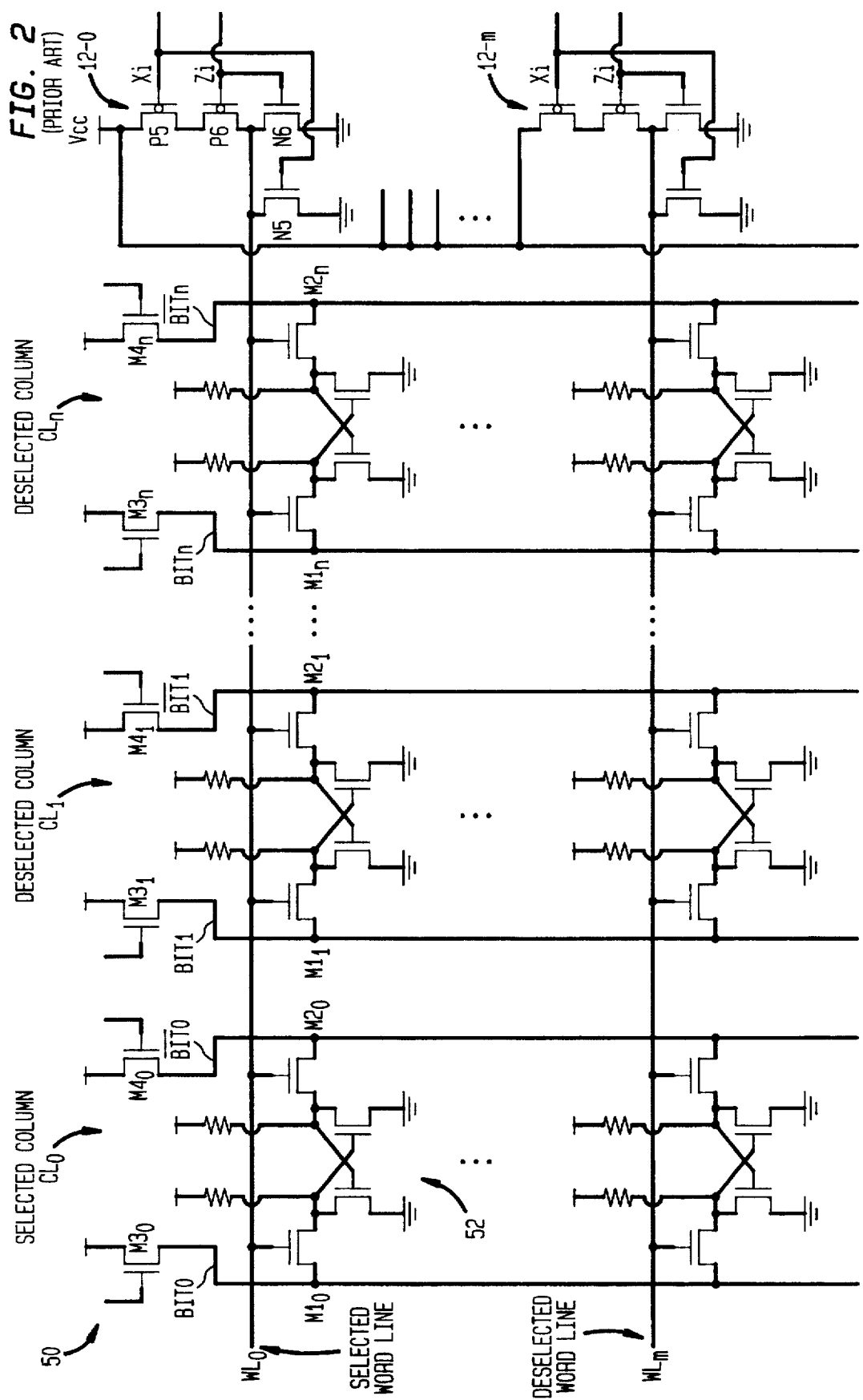

CIRCUIT WITH REGULATED POWER SUPPLY FOR REDUCING MEMORY DEVICE OPERATING POWER

FIELD OF THE INVENTION

The present invention relates to an SRAM array with reduced operating power consumption.

BACKGROUND OF THE INVENTION

An SRAM (Static Random Access Memory) cell is shown in FIG. 1. FIG. 1 schematically illustrates an SRAM cell 10. The SRAM cell 10 comprises first and second drivers N1 and N2. Illustratively, the drivers N1 and N2 are pulldown NMOS devices. The source 12 of N1 and the source 14 of N2 are connected to a reference voltage Vss which, for example, is ground. The drain 16 of N2 is connected to the gate 18 of N1. The drain 20 of N1 is connected to the gate 22 of N2. The SRAM cell 10 of FIG. 1 also comprises two load devices L1 and L2. The load devices L1 and L2 each have one terminal 24, 26 connected to a reference voltage Vcc and another terminal 28, 30 connected to the drains 20, 16 of N1 and N2, respectively. The reference Vcc is positive with respect to Vss.

The SRAM cell 10 also comprises two additional NMOS devices M1 and M2. The devices M1 and M2 are pass transistors. The gates 32, 34 of M1 and M2 are connected to a wordline whose signal value is designated WORD. The sources 36, 38 of M1 and M2 are connected to bit lines 33, 35 whose signal values are designated BIT and $\overline{BIT}$, respectively. The drains 40, 42 of M1 and M2 are connected the drains 20, 16 of N1 and N2, respectively. The bit lines 33, 35 are connected to the reference voltage Vcc via the NMOS devices M3, M4. The signals BIT and $\overline{BIT}$ are applied to the bit lines 33 and 35 by applying appropriate signals to the gates of M3 and M4, respectively.

To write the cell, DATA (logic "1" or logic "0") is placed on the BIT line 33 and $\overline{DATA}$ is placed on the $\overline{BIT}$ 35 line. Then WORD is asserted. A read operation commences by precharging the BIT and $\overline{BIT}$ lines. The WORD signal is asserted and either the BIT or $\overline{BIT}$ line will be discharged by one of the pull down transistors N1 or N2.

The current path of the SRAM cell of FIG. 1 is indicated by the path 39 (or 41). The current path is along the bit line 33 (or 35), through M1 (or M2), and through the driver N1 (or N2) to ground.

The purpose of the load devices L1 and L2 is to counteract the effect of charge leakage at the drains 20, 16 of N1 and N2. The load devices L1 and L2 may be polycrystalline silicon resistors or PMOS devices. In the case where L1 and L2 are PMOS devices, the sources of the PMOS devices are connected to Vcc; the drains of the PMOS devices are connected to the drains 20, 16 of N1 and N2. The gates of the PMOS devices L1, L2 are connected to the gates of the NMOS pull down driver devices N1, N2, respectively.

To reduce the size of the SRAM cell 10 and for use in advanced applications, where higher density and lower standby power is required, the load devices L1 and L2 may be implemented as thin film transistor (TFT) PMOS devices. In this case, the SRAM cell is known as a TFT SRAM cell.

FIG. 2 shows an m x n array 50 of memory cells 52 of the type shown in FIG. 1. The array of cells is organized into rows and columns. The columns are designed CL0, CL1, . . . , CLn. Each column has two bit lines associated with it. These bit lines are designed BIT0, $\overline{BIT0}$, BIT 1, $\overline{BIT1}$; . . . ; BITn, $\overline{BITn}$. The bit lines are connected to Vcc by the NMOS devices $M3_0$, $M4_0$, $M3_1$, $M4_1$, . . . , $M3_n$, $M4_n$. The bit lines are precharged for a read operation using the NMOS devices M3, M4. For a write operation DATA and $\overline{DATA}$ signals are placed on the bit lines via the devices M3, M4. Each row of cells has a wordline WL0, WL1, . . . , WLm. Each wordline has associated with it a wordline decoder 12-0, 12-1, . . . , 12-m which comprises the PMOS devices P5, P6 and the NMOS devices N5, N6.

The decoder is shown in greater detail in FIG. 3. The wordline, WL, is connected to the common drain of P6, N6. The source of P5 is connected directly to Vcc. The signal $z_i$ is an block select signal. The signal $x_i$ is an address signal for the $i^{th}$ wordline. The $i^{th}$ wordline is asserted when $x_i$ and $z_i$ are asserted.

In operation, in order to select a particular cell in the array (e.g., the cell which is in a CL0 and also WL0), a corresponding wordline, (e.g., WL0), and bit line pair (e.g. BIT0, and $\overline{BIT0}$) need to be turned on (i.e., asserted). When the wordline turns on, every memory cell in that wordline will consume power. The memory cell current (see FIG. 1) pretty much determines the delay time in the cell array. To meet speed requirements, an SRAM designer needs to account for the worst case current at low Vcc power supply voltage. On the other hand, the worst case power consumption happens at high Vcc power supply voltage because cell current is proportional to wordline voltage. As shown above, when a wordline is asserted, its voltage is at Vcc. It is the object of the invention to reduce the power consumption when a wordline is asserted in an SRAM array.

Several schemes have been proposed in the prior art for reducing the power consumption in an SRAM when a wordline is asserted. One way to cut the cell array operating power is to use a pulse wordline scheme that turns off the selected wordline after the data is read out and latched at the output. However, this scheme makes design timing more complicated and makes the SRAM array more sensitive to process variations. Another prior art scheme is to only turn on the selected memory cell when a wordline is selected. However, this scheme results in a significant increase in cell size.

Accordingly, it is an object of the invention to provide an SRAM which has reduced power consumption when a word line is asserted and which does not suffer from the short comings of the above-mentioned prior art SRAM power reduction schemes.

SUMMARY OF THE INVENTION

In accordance with a preferred embodiment of the invention, the wordline turn on voltage is suppressed (e.g., maintained at or below 4.5 volts). This is accomplished by connecting a regulated voltage supply output to the wordline. The regulated voltage supply has a transfer function such that the Vccr (the output of the regulated voltage supply) does not exceed a threshold $V_T$ such as 4.5 volts. For example, the transfer function may be:

Vccr=Vcc for Vcc<4.5 volts

Vccr=4.5 volts for Vcc≧4.5 volts

As indicated above, the power consumed in an SRAM array is proportioned to the selected wordline voltage. In accordance with the present invention, the power consumption will be generally unchanged when Vcc exceeds 4.5 volts.

BRIEF DESCRIPTION OF THE DRAWING

FIG. 2 schematically illustrates a conventional SRAM array.

DETAILED DESCRIPTION OF THE INVENTION

Figure 1:
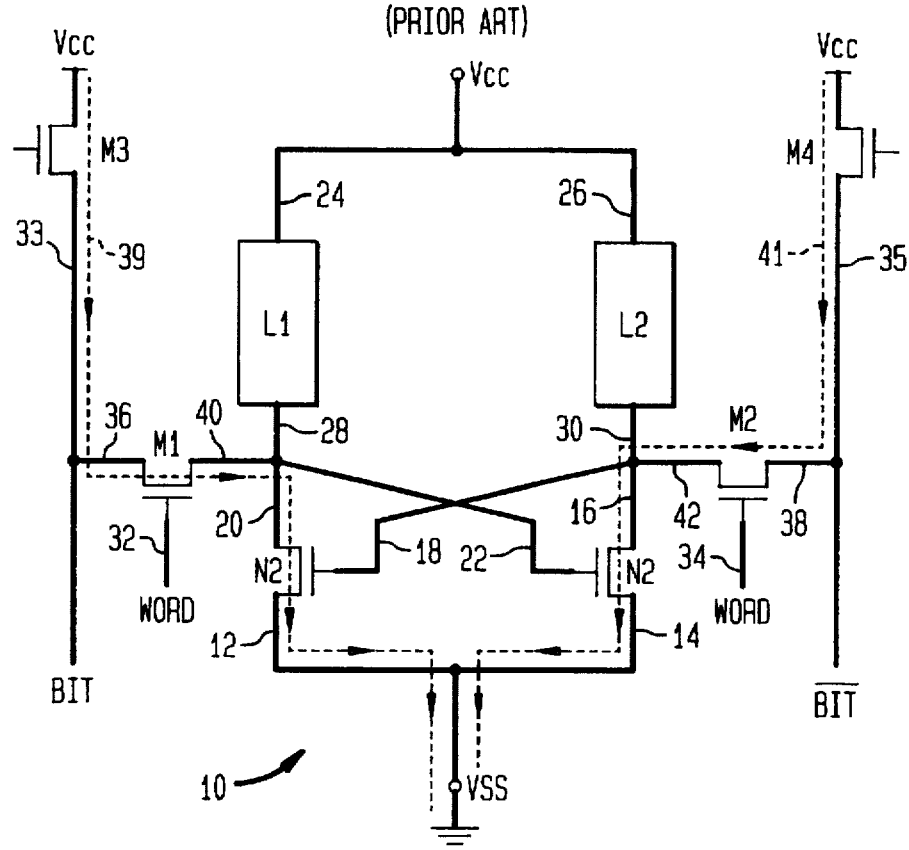
FIG. 1 schematically illustrates a conventional SRAM cell.
Figure 3:
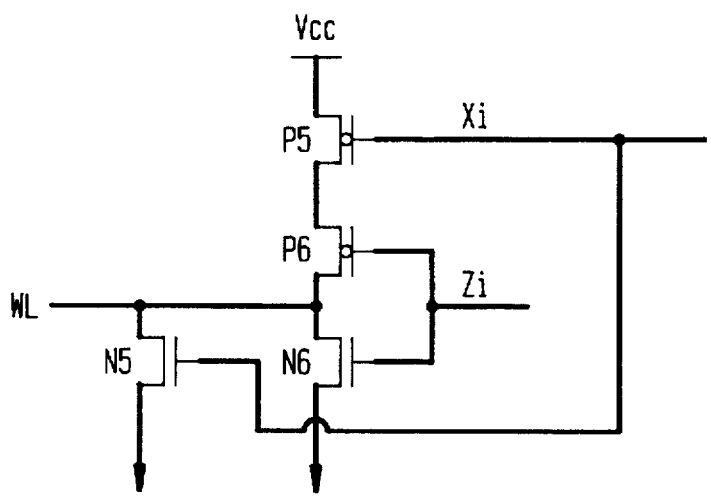
FIG. 3 illustrates in greater detail a decoder which is attached to a wordline in the array of FIG. 2.
Figure 4:
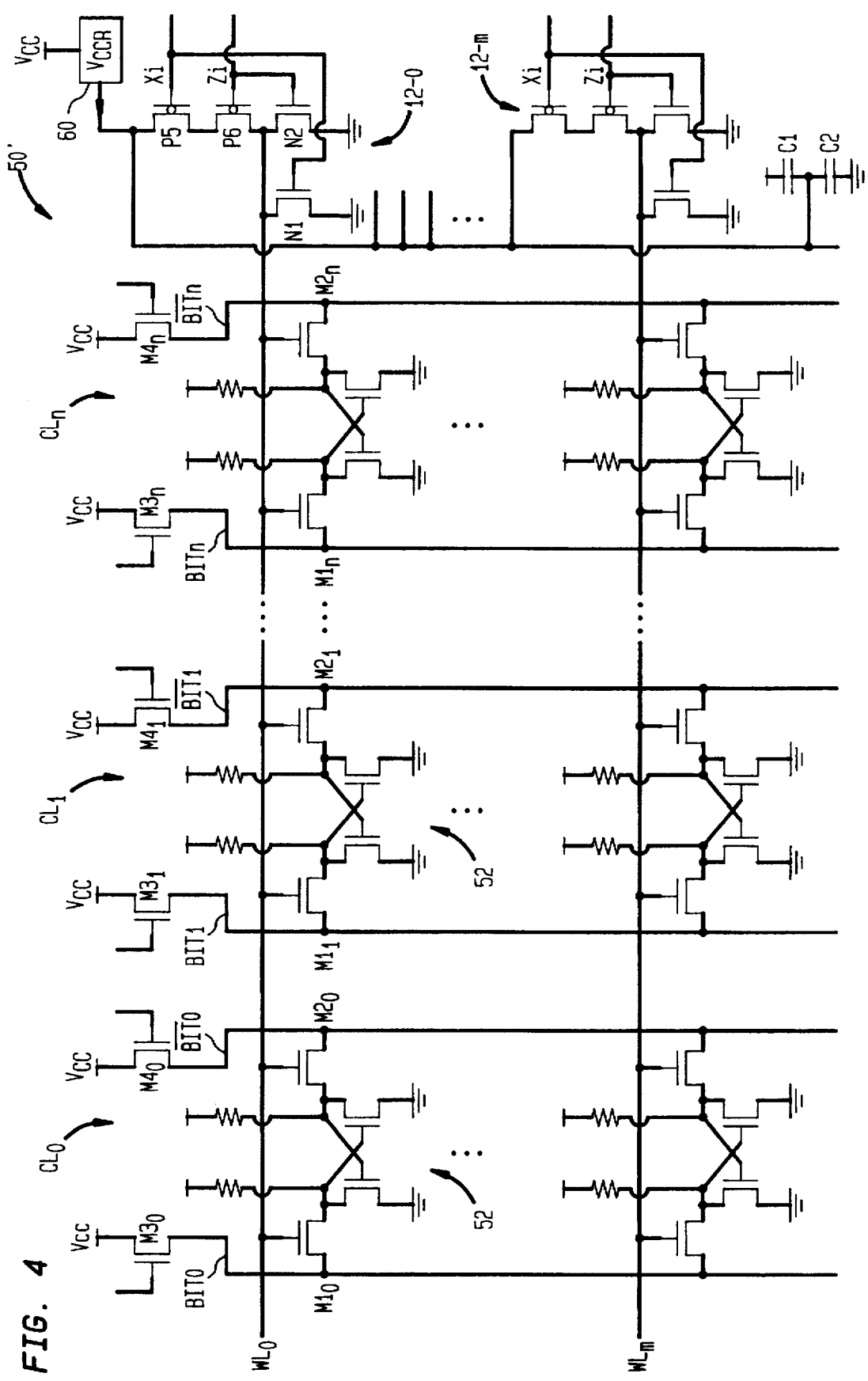
FIG. 4 illustrates an SRAM array in accordance with an illustrative embodiment of the present invention including a regulated voltage supply connected to each wordline to reduce power consumption.

FIG. 4 shows an SRAM array 50' in accordance with an illustrative embodiment of the invention. The SRAM array 50' of FIG. 4 is identical to the SRAM array 50 of FIG. 2 except that the decoders 12-0, 12-1, . . . , 12-m are not connected to the Vcc. Instead, each decoder 12-0, 12-1, . . . , 12-m is connected to an output of a regulated voltage supply 60. In particular, the source of P5 in each decoder is connected to the output Vccr of the regulated voltage supply 60. Thus, the voltage applied to each asserted wordline in the SRAM array 50 is determined by the voltage Vccr which is output by the regulator 60.

Illustratively, the voltage Vccr never exceeds a threshold such as 4.5 volts. In this matter, the power consumed by the SRAM array is limited. The reason is that the power consumed by the SRAM depends on the voltage applied to assert a wordline. If this voltage is limited to 4.5 volts, for example, then the power consumed will be limited also.

Illustratively, the transfer function of the regulated voltage supply

Vccr=Vcc for Vcc<4.5 Volts

Vccr=4.5 V for Vcc≧4.5 Volts

Figure 5:
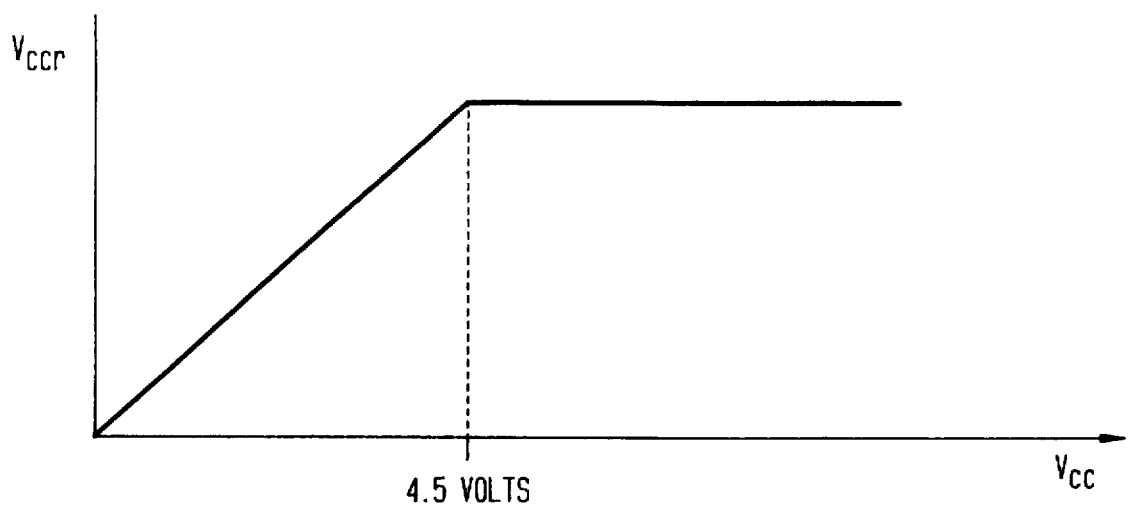
FIG. 5 shows an output voltage characteristic of the regulated voltage supply of FIG. 4.

This voltage characteristic is plotted in FIG. 5.

In this manner the voltage applied to a wordline is limited to a threshold, such as, 4.5 volts and the power consumption of the SRAM is therefore limited.

The capacitors C1 and C2 at the Vccr output serve to provide enough charging capability to a selected wordline due to the fact that only an ac current is necessary to be supplied to the row decoder of this invention.

Figure 6:
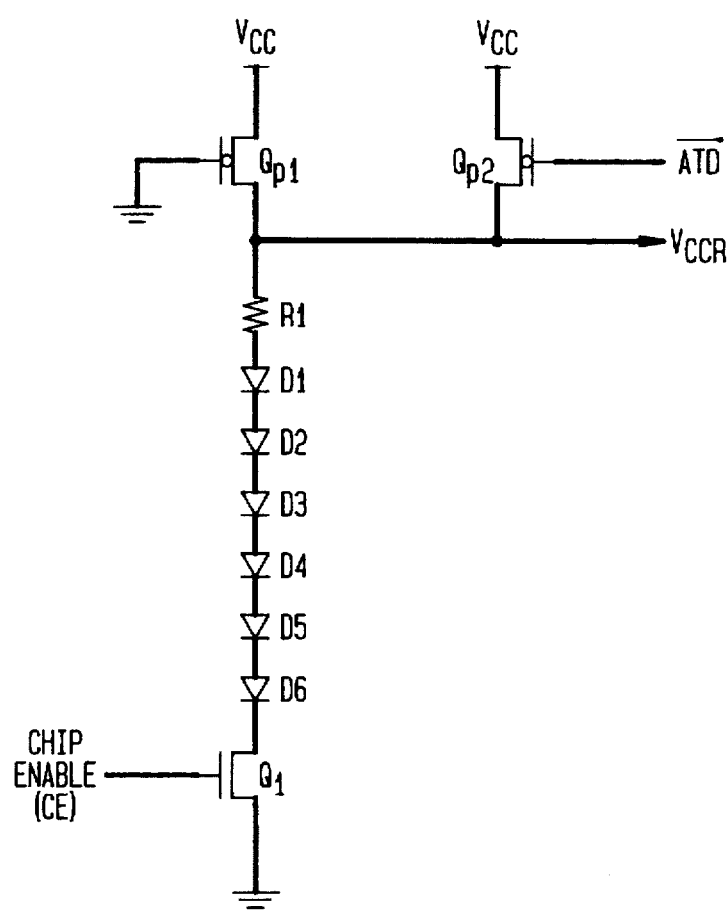
FIG. 6 illustrates a first embodiment of a regulated voltage supply for use in the SRAM array of FIG. 4.

A first embodiment of a voltage regulator circuit 60 is shown in FIG. 6. The output voltage is Vccr. In FIG. 6, D1 to D6 are PN junction diodes implemented by a P-well to N⁺ source drain junction in a MOSFET and will serve as a Vccr clamp when the Vccr exceeds 4.5 volts. The NMOS device Q1 serves to shut off the DC current path of this regulator during a standby condition of the SRAM. The current path is turned on by the chip enable signal CE applied to the NMOS device Q1. R1 is chosen so as to define the slope of the Vccr regulated output as a function of Vcc. Qp1 is a small PMOS for reducing the DC current overhead of this regulator. Qp2 is a PMOS device to which an ATD signal is applied. The current path provided by $Q_{p2}$ enables Vccr to be charged up to the threshold limit (e.g., 4.5 volts) more rapidly during a wordline transition.

Figure 7:
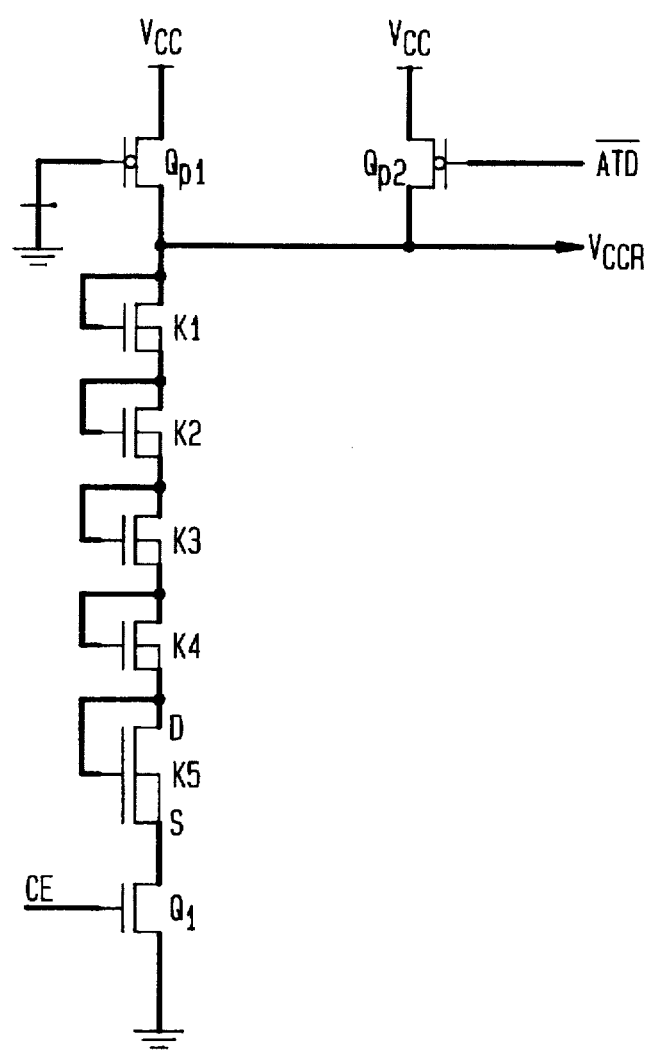
FIG. 7 illustrates a second embodiment of a regulated voltage supply for use in the SRAM array of FIG. 4.

FIG. 7 is an alternative embodiment of the voltage regulator 60. In this embodiment of the regulator, the diodes D1-D6 of FIG. 6 are replaced by the NMOS transistors K1-K5 and the resistor R1 is eliminated. The NMOS devices K1-K5 clamp Vccr at 4.5 volts or below. The size of the NMOS devices K1-K5 is chosen to regulate the slope of the voltage regulator.

Finally, the above-discussion is intended to be merely illustrative of the invention. Numerous alternative embodiments may be devised by those having ordinary skill in the art without departing from the spirit and scope of the following claims.

The claimed invention is:

1. A SRAM array having reduced power consumption comprising a plurality of SRAM cells arranged in an array of rows and columns, the gates of pass transistors of said cells in each row being connected to a regulated supply output voltage VCCR, said regulated supply output voltage output from a power supply, said regulated supply output voltage is below a threshold voltage $V_t$ when said power supply voltage exceeds said threshold, a decoder circuit associated with each wordline for applying said regulated supply output voltage to each wordline when the wordline is selected, the regulated supply output voltage applied to said selected wordline thereby being below said threshold voltage when said power supply voltage exceeds said threshold so as to reduce the power consumption of said SRAM array.

2. The SRAM array of claim 1 wherein said regulated output voltage Vccr is given by:

Vccr=Vcc for Vcc<$V_T$

Vccr=$V_T$ for Vcc≧$V_T$.

3. The SRAM array of claim 1 wherein said voltage regulator comprises a plurality of diodes connected in series for clamping Vccr at or below $V_T$.

4. The SRAM array of claim 1 wherein said voltage regulator comprises a plurality of MOSFETs connected to in series for clamping Vccr at or below $V_T$.

* * * * *